United States Patent
Chiu et al.

(10) Patent No.: US 6,812,044 B2
(45) Date of Patent: Nov. 2, 2004

(54) ADVANCED CONTROL FOR PLASMA PROCESS

(75) Inventors: Hsien-Kuang Chiu, Hsin Chu (TW); Bor-Wen Chan, Hsinchu (TW); Baw-Ching Perng, Hsin-Chu (TW); Yuan-Hung Chiu, Taipei (TW); Hun-Jan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/324,465

(22) Filed: Dec. 19, 2002

(65) Prior Publication Data

US 2004/0121603 A1 Jun. 24, 2004

(51) Int. Cl.[7] .............................................. H01L 21/00
(52) U.S. Cl. ............................ 438/8; 438/9; 438/706; 438/710
(58) Field of Search ............................ 438/9, 706, 710, 438/714, 8, 729

(56) References Cited

U.S. PATENT DOCUMENTS

| 4,576,692 | A | * | 3/1986 | Fukuta et al. ............... 204/165 |
| 5,372,673 | A | * | 12/1994 | Stager et al. .................. 438/8 |
| 5,739,051 | A | * | 4/1998 | Saito ........................... 438/16 |
| 5,807,761 | A | * | 9/1998 | Coronel et al. ............... 438/14 |
| 5,861,752 | A | * | 1/1999 | Klick .......................... 324/464 |
| 6,287,980 | B1 | * | 9/2001 | Hanazaki et al. ........... 438/726 |
| 2003/0230551 | A1 | * | 12/2003 | Kagoshima et al. .......... 216/72 |

* cited by examiner

*Primary Examiner*—Kin-Chan Chen
(74) *Attorney, Agent, or Firm*—Tung & Associates

(57) ABSTRACT

A method for monitoring plasma parameters during a plasma process such as a plasma etching process, comparing the measured plasma parameters to predetermined parameter specifications, and either terminating the plasma process or modifying the plasma process in progress to re-establish the plasma parameters within the parameter specifications. The plasma parameters may be measured by the self-excited electron resonance spectroscopy (SEEKS) technique or by microwave interferometry.

11 Claims, 2 Drawing Sheets

ADVANCED CONTROL FOR PLASMA PROCESS

FIELD OF THE INVENTION

The present invention relates to plasma processes used in the fabrication of semiconductor integrated circuits on semiconductor wafer substrates. More particularly, the present invention relates to a method for monitoring plasma parameters during a plasma process and in-situ termination or modification of the process in the event that the plasma parameters fall outside plasma parameter specifications.

BACKGROUND OF THE INVENTION

Integrated circuits are formed on a semiconductor substrate, which is typically composed of silicon. Such formation of integrated circuits involves sequentially forming or depositing multiple electrically conductive and insulative layers in or on the substrate. Etching processes may then be used to form geometric patterns in the layers or vias for electrical contact between the layers. Etching processes include "wet" etching, in which one or more chemical reagents are brought into direct contact with the substrate, and "dry" etching, such as plasma etching.

Various types of plasma etching processes are known in the art, including plasma etching, reactive ion (RI) etching and reactive ion beam etching. In each of these plasma processes, a gas is first introduced into a reaction chamber and then plasma is generated from the gas. This is accomplished by dissociation of the gas into ions, free radicals and electrons by using an RF (radio frequency) generator, which includes one or more electrodes. The electrodes are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

In the fabrication of semiconductor devices, particularly sub-micron scale semiconductor devices, profiles obtained in the etching process are very important. Careful control of a surface etch process is therefore necessary to ensure directional etching. In conducting an etching process, when an etch rate is considerably higher in one direction than in the other directions, the process is called anisotropic. A reactive ion etching (RIE) process assisted by plasma is frequently used in an anisotropic etching of various material layers on top of semiconductor substrate. In plasma enhanced etching processes, the etch rate of a semiconductor material is frequently larger than the sum of the individual etch rates for ion sputtering and individual etching due to a synergy in which chemical etching is enhanced by ion bombardment.

To avoid subjecting a semiconductor wafer to high-energy ion bombardment, the wafer may also be placed downstream from the plasma and outside the discharge area. Downstream plasma etches more in an isotropic manner since there are no ions to induce directional etching. The downstream reactors are frequently used for removing resist or other layers of material where patterning is not critical. In a downstream reactor, radio frequency may be used to generate long-lived radioactive species for transporting to a wafer surface located remote from the plasma. Temperature control problems and radiation damage are therefore significantly reduced in a downstream reactor. Furthermore, the wafer holder can be heated to a precise temperature to increase the chemical reaction rate, independent of the plasma.

In a downstream reactor, an electrostatic wafer holding device known as an electrostatic chuck is frequently used. The electrostatic chuck attracts and holds a wafer positioned on top electrostatically. The electrostatic chuck method for holding a wafer is highly desirable in the vacuum handling and processing of wafers. An electrostatic chuck device can hold and move wafers with a force equivalent to several tens of Torr pressure, in contrast to a conventional method of holding wafers by a mechanical clamping method.

Referring to the schematic of FIG. 1, a conventional plasma etching system is generally indicated by reference numeral 10. The etching system 10 includes a reaction chamber 12 having a typically grounded chamber wall 14. An electrode, such as a planar coil electrode 16, is positioned adjacent to a dielectric plate 18 which separates the electrode 16 from the interior of the reaction chamber 12. A second electrode 20 is provided in the bottom portion of the reaction chamber 12. Plasma-generating source gases are introduced into the reaction chamber 12 by a gas supply (not shown). Volatile reaction products and unreacted plasma species are removed from the reaction chamber 12 by a gas removal mechanism, such as a vacuum pump (not shown).

The dielectric plate 18 illustrated in FIG. 1 may serve multiple purposes and have multiple structural features, as is well known in the art. For example, the dielectric plate 18 may include features for introducing the source gases into the reaction chamber 12, as well as those structures associated with physically separating the electrode 16 from the interior of the chamber 12.

Electrode power such as a high voltage signal, provided by a power generator such as an RF (radio frequency) generator (not shown), is applied to the electrode 16 to ignite and sustain a plasma in the reaction chamber 12. Ignition of a plasma in the reaction chamber 12 is accomplished primarily by electrostatic coupling of the electrode 16 with the source gases, due to the large-magnitude voltage applied to the electrode 16 and the resulting electric fields produced in the reaction chamber 12. Once ignited, the plasma is sustained by electromagnetic induction effects associated with time-varying magnetic fields produced by the alternating currents applied to the electrode 16 and the electrode 20. The plasma may become self-sustaining in the reaction chamber 12 due to the generation of energized electrons from the source gases and striking of the electrons with gas molecules to generate additional ions, free radicals and electrons. A semiconductor wafer 22 is positioned in the reaction chamber 12 and is supported by the electrode 20. The electrode 20 is typically electrically-biased by a bias voltage 24 to provide ion energies that are independent of the RF voltage applied to the electrode 16 and that impact the wafer 22.

In the etching of conductive and insulative layers on wafer substrates, chamber condition monitoring is important to prevent drifting of plasma parameters, particularly plasma electron density and electron collision rate, outside of preset parameter specifications. Traditional monitoring techniques include the use of monitor wafers to probe the etch rate and uniformity variation for a particular plasma process. However, this method is time-consuming and costly. Moreover, the data obtained through use of the monitor wafers may not be sufficiently sensitive to detect crucial deviations in process parameters from the specification. Accordingly, a cheaper and more accurate method of monitoring plasma parameters in a plasma process is needed.

As shown in FIG. 2, a strong correlation exists between the etch rate of a polysilicon layer (indicated by the connected circles) and the electron collision rate (indicated by the connected triangles). The plasma electron collision rate is proportional to the plasma electron density. Accordingly, it is proposed that maintaining the plasma electron density and electron collision rate within upper and lower limits during a plasma process can facilitate optimal plasma etching or plasma-mediated material deposition.

An object of the present invention is to provide a novel method for monitoring plasma parameters in a plasma process.

Another object of the present invention is to provide a novel and cost-effective method for monitoring plasma parameters in a plasma process.

Still another object of the present invention is to provide a novel and accurate method for monitoring plasma parameters in a plasma process.

Yet another object of the present invention is to provide a method for in-situ monitoring and control of plasma parameters during a plasma process.

Another object of the present invention is to provide a method for in-situ monitoring of the electron density and/or collision rate of electrons in a plasma during a plasma process in order to either maintain either or both of these plasma parameters within predetermined parameter specifications or terminate the plasma process in the event that the monitored plasma parameter or parameters drift outside the specifications.

A still further object of the present invention is to provide a method which monitors both plasma parameter data and tool parameter data from a plasma process tool, compares the parameters to preset parameter specifications, continues the plasma process in the event that the parameters remain within the specifications, and terminates the plasma process in the event that the parameters drift outside the specifications.

Yet another object of the present invention is to provide a method which measures plasma parameter data from a plasma process tool during a plasma process, compares the obtained data to preset plasma parameter specifications, and adjusts or modifies the process recipe or season procedure.

SUMMARY OF THE INVENTION

In accordance with these and other objects and advantages, the present invention is generally directed to a method for monitoring plasma parameters during a plasma process such as a plasma etching process or plasma deposition process, comparing the measured plasma parameters to predetermined parameter specifications, and either terminating the plasma process or modifying the plasma process in progress to re-establish the plasma parameters within the parameter specifications. The plasma parameters may be measured by the self-excited electron resonance spectroscopy (SEEKS) technique or by microwave interferometry. In one embodiment, both plasma parameter data and tool parameter data are obtained from a plasma process tool, and these parameters are compared to preset parameter specifications. The plasma process is continued in the event that the obtained parameters remain within the parameter specifications, and is terminated in the event that the parameters drift outside the specifications. In another embodiment, the plasma parameter data obtained from the plasma process tool during the plasma process is constantly compared to preset plasma parameter specifications, and the process recipe or season procedure for the plasma process is adjusted to bring the plasma parameters back to within the specifications.

BRIEF DESCRIPTION OF THE DRAWINGS

The invention will now be described, by way of example, with reference to the accompanying drawings, in which.

DESCRIPTION OF THE PREFERRED EMBODIMENTS

The present invention comprises a method for monitoring plasma parameters during a plasma process such as a plasma etching process or plasma deposition process and comparing the measured plasma parameters to predetermined parameter specifications in order to ensure that the measured plasma parameters remain within predetermined parameter specifications for optimal plasma processing. In one embodiment, in the event that the measured plasma parameters drift outside of the specifications, the plasma process is terminated, usually based on input corresponding to either or both the tool parameters (RF power and chamber pressure) and plasma parameters (electron collision rate and/or electron density). In another embodiment, a closed control loop provides in-situ feedback control of the plasma process. Based on input corresponding to the measured plasma parameters (electron collision rate and electron density), the plasma process is modified in progress to re-establish the measured plasma parameters within the parameter specifications or to modify the conditioning process between wafers or before running a lot (seasoning process). In either embodiment, the plasma parameters may be measured by the self-excited electron resonance spectroscopy (SEEKS) technique, in accordance with the method disclosed in U.S. Pat. No. 5,861,752, which is incorporated herein by reference in its entirety. That technique measures the radio frequency discharge current in the plasma reactor, converts the measured analog data into digital signals and interprets the digital data into electron density and/or electron collision rate according to a mathematical algorithm. Alternatively, the electron density and/or electron collision rate plasma parameters may be determined by conventional microwave interferometry techniques.

Figure 1:
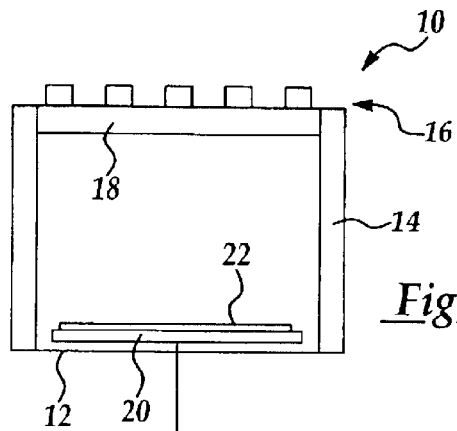
FIG. 1 is a cross-sectional, partially schematic, view of a typical conventional plasma process reaction chamber.
Figure 2:
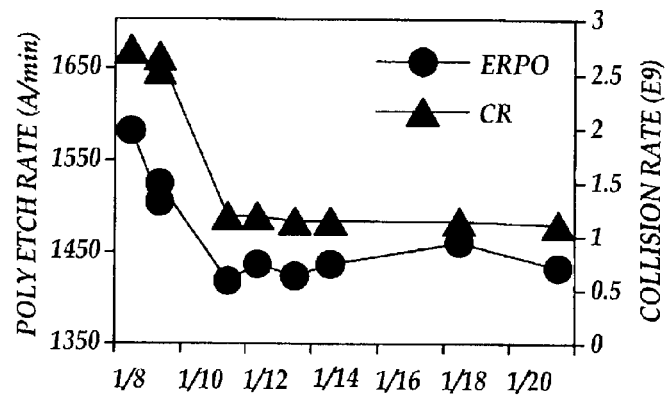
FIG. 2 is a graph which illustrates correlation between the electron collision rate and the etch rate in a plasma etch process.
Figure 3:
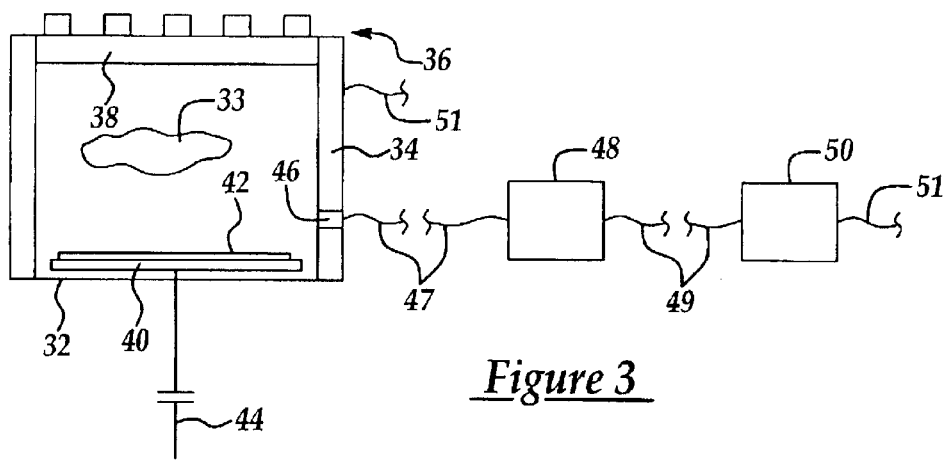
FIG. 3 is a cross-sectional, partially schematic, view of a plasma process chamber in implementation of the present invention.

Referring to FIG. 3, a plasma process system 30 suitable for implementation of the present invention is shown. Such a plasma process system 30 may be a system suitable for plasma etching or plasma deposition processes and includes a reaction chamber 32 having a typically grounded chamber wall 34. The reaction chamber 32 is preferably an RF-discharge type reactor that operates under low pressures (<300 mTorr). However, the present invention may be equally applicable to other systems. An electrode, such as a planar coil electrode 36, is positioned adjacent to a dielectric plate 38 which separates the electrode 36 from the interior of the reaction chamber 32. The dielectric plate 38 may include features for introducing the source gases into the reaction chamber 32, as well as structures associated with physically separating the electrode 36 from the interior of the chamber 32, as is known in the art. A second electrode 40 is provided in the bottom portion of the reaction chamber 32. The second electrode 40 is typically electrically-biased by a bias voltage 44 to provide ion energies that are independent of the RF voltage applied to the electrode 36. Plasma-generating source gases are introduced into the reaction chamber 32 by a gas supply (not shown). Volatile reaction products and unreacted plasma species are removed from the reaction chamber 32 by a gas removal mechanism, such as a vacuum pump (not shown).

In accordance with the present invention, a probe 46 is provided in the chamber wall 34. In one embodiment, the invention is carried out using the self-excited electron resonance spectroscopy (SEEKS) technique, in accordance with the method disclosed in U.S. Pat. No. 5,861,752. Accordingly, the probe 46 is capable of measuring a radio frequency (RF) discharge current generated by the electrode 36 and the electrode 40 inside the reaction chamber 32. In another embodiment, the probe 46 is a microwave interferometer which is capable of measuring the electron density and/or electron collision rate of a plasma in the reaction chamber 32. The probe 46 is connected typically through a coaxial cable 47 to a data processing device 48, which may be a personal computer. An analog/digital converter (not shown) may be provided between the probe 46 and the data processing device 48 for converting analog signals from the probe 46 into digital signals which are sent to the data processing device 48. The data processing device 48 is connected, through suitable wiring 49, to a process controller 50. The process controller 50 is connected to the various operational components of the reaction chamber 32 typically through wiring 51 and controls the tool and plasma parameters for plasma processes in the reaction chamber 32.

Figure 4:
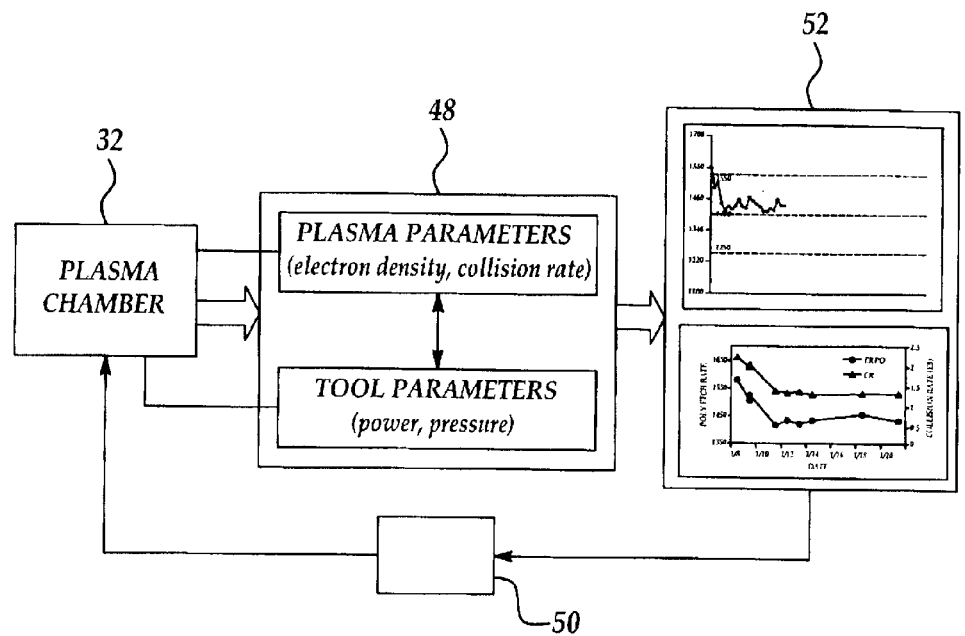
FIG. 4 is a schematic view illustrating implementation of the present invention according to one embodiment.

In application, referring to FIGS. 3 and 4, the method of the present invention in one embodiment may be used for in-situ monitoring of the plasma electron collision rate, electron density or both electron collision rate and electron density while a plasma etching or deposition process is conducted in the reaction chamber 32. Accordingly, a desired parameter specification range including upper and lower limits for either or both of the electron density and the electron collision rate are initially programmed into the data processing device 48. For example, the data processing device 48 may be programmed to define an upper limit for the electron density or collision parameter specification range based on a 10% increase with respect to an optimum value and a lower limit based on a 10% decrease with respect to the optimum value. The upper and lower limits for the parameter specifications may be determined using the SPC (statistical process control) method. These ranges for the electron density and the electron collision rate will vary according to the particular plasma process conducted in the reaction chamber 32. A semiconductor wafer 42, which may be constructed of silicon or any other suitable material, is positioned in the reaction chamber 32 and is typically supported by the electrode 40.

During the plasma process, electrode power such as a high voltage signal, provided by a power generator such as an RF (radio frequency) generator (not shown), is applied to the electrode 36 of the system 30 to ignite and sustain a plasma in the reaction chamber 32, in conventional fashion. Ignition of a plasma 33 in the reaction chamber 32 is accomplished primarily by electrostatic coupling of the electrode 36 with the source gases, due to the large-magnitude voltage applied to the electrode 36 and the resulting electric fields produced in the reaction chamber 32. Once ignited, the plasma 33 is sustained by electromagnetic induction effects associated with time-varying magnetic fields produced by the alternating currents applied to the electrode 36 and the electrode 40. The plasma 33 may become self-sustaining in the reaction chamber 32 due to the generation of energized electrons from the source gases and striking of the electrons with gas molecules to generate additional ions, free radicals and electrons. The electrode 20 is typically electrically-biased by a bias voltage 24 to provide ion energies that are independent of the RF voltage applied to the electrode 16 and that impact the wafer 22.

As the radio frequency alternating electric field generated by the electrode 36 and the electrode 40 splits the plasma gas molecules into free electrons and positive ions in the reaction chamber 32, the radio frequency discharge current is measured by the probe 46. The analog value of the RF discharge current is converted into the digital value and transmitted to the data processing device 48, which converts the digital value of the RF discharge current to the electron density and/or electron collision rate values of the electrons in the plasma 33, using a set of algorithms according to the method disclosed in U.S. Pat. No. 5,861,752. Alternatively, the electron density and/or electron collision rate values of the electrons in the plasma 33 may be determined using a conventional microwave interferometer method, according to the knowledge of those skilled in the art. Accordingly, the data processing device 48 continually monitors the plasma electron density and/or plasma electron collision rate and compares either or both of these values to the plasma parameter specification range previously programmed into the data processing device 48. The measured values for the electron density and/or the electron collision rate may be plotted on a trend chart 52, as shown in FIG. 4. In the event that the plasma electron collision rate or the plasma electron density either drifts above the upper limit or below the lower limit for the corresponding collision rate or electron density specification value, the data processing device 48 transmits this data to the process controller 50, which terminates the plasma process by de-activating the plasma-generating components of the reaction chamber 32.

As further shown in FIG. 4, the data processing device 48 may be programmed to interpret tool parameter data, particularly RF generator power and chamber pressure, along with the plasma electron density and/or plasma electron collision rate from the probe 46. In that case, the data processing device 48 continually compares the tool parameter data with tool parameter data specifications previously programmed into the data processing device 48 throughout the plasma process. In the event that the measured tool parameter data drifts outside the upper or lower limit of the specifications, appropriate data is transmitted to the process controller 50, which terminates operation of the reaction chamber 32. Thus, the measured plasma parameter values must remain within the programmed plasma parameter specifications and the measured tool parameter values must remain within the programmed tool parameter specifications in order for the plasma process to be completed.

Figure 5:
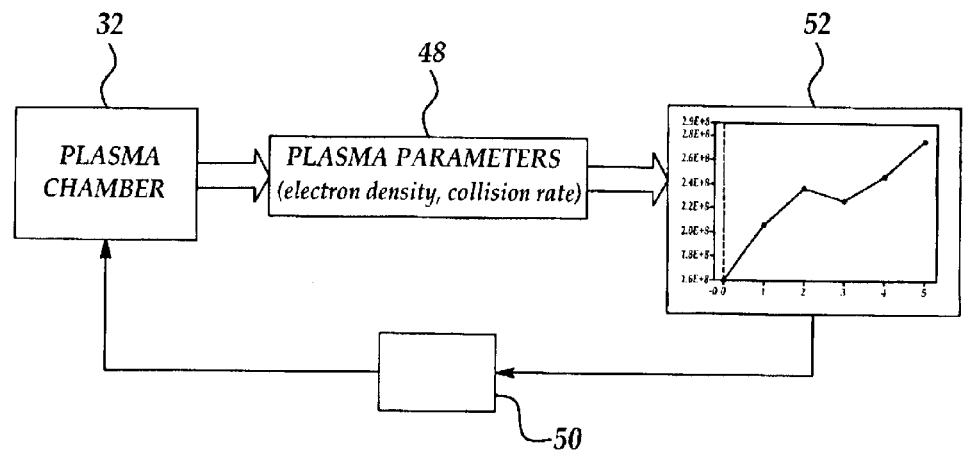
FIG. 5 is a schematic view illustrating implementation of the present invention according to another embodiment.

Referring again to FIG. 3 and to FIG. 5, an alternative method of the present invention is shown, wherein a closed control loop provides in-situ feedback control of the plasma process. In the event that the plasma electron density and/or the plasma electron collision rates calculated by the data processing device 48 drifts outside the corresponding plasma parameter specification value range, the process controller 50 actuates the appropriate control elements of the reaction chamber 32 to adjust the plasma process conditions in the reaction chamber 32 in such a manner that the measured plasma parameters return to within the parameter specification range. This adjustment of the plasma process conditions may be conducted by in-situ modification of the plasma process recipe, in-situ modification of the conditioning process between successive wafers processed in the reaction chamber 32, or in-situ modification of the conditioning process before a lot is run (seasoning process).

While the preferred embodiments of the invention have been described above, it will be recognized and understood that various modifications can be made in the invention and the appended claims are intended to cover all such modifications which may fall within the spirit and scope of the invention.

What is claimed is:

1. A method for in-situ monitoring and controlling of a plasma process, comprising the steps of:

providing a plasma reactor;

generating a plasma in said plasma reactor;

calculating an electron density of said plasma;

comparing said electron density to an electron density specification; and terminating operation of said plasma reactor when said electron density falls outside said electron density specification.

2. The method of claim 1 wherein said plasma reactor comprises a radio frequency discharge reactor and operates under a pressure of less than 300 mTorr.

3. The method of claim 1 wherein said electron density of said plasma is calculated using self-excited electron resonance spectroscopy.

4. The method of claim 1 wherein said electron density of said plasma is calculated using microwave interferometry.

5. The method of claim 1 wherein said electron density specification comprises an upper limit and a lower limit.

6. The method of claim 1 wherein said plasma process comprises a plasma etching process.

7. A method for in-situ monitoring and controlling of a plasma process, comprising the steps of:

providing a plasma reactor;

generating a plasma in said plasma reactor;

calculating an electron collision rate of said plasma;

comparing said electron collision rate to an electron collision rate specification; and modifying process conditions in said plasma reactor to return said electron collision rate to within said electron collision rate specification when said electron collision rate falls outside said electron collision rate specification.

8. The method of claim 7 wherein said plasma reactor comprises a radio frequency discharge reactor and operates under a pressure of less than 300 mTorr.

9. The method of claim 7 wherein said electron collision rate of said plasma is calculated using self-excited electron resonance spectroscopy.

10. The method of claim 7 wherein said electron collision rate of said plasma is calculated using microwave interferometry.

11. The method of claim 7 wherein said electron collision rate specification comprises an upper limit and a lower limit.

* * * * *